(12) United States Patent
Vercesi et al.

(10) Patent No.: US 9,002,301 B1
(45) Date of Patent: Apr. 7, 2015

(54) AVOIDING FREQUENCY SPIKES IN MODULATED SYSTEMS

(71) Applicant: Marvell International Ltd., Hamilton (BM)

(72) Inventors: Luca Vercesi, Pavia (IT); Fernando De Bernardinis, Pavia (IT)

(73) Assignee: Marvell International Ltd., Hamilton (BM)

( * ) Notice: Subject to any disclaimer, the term of this patent is extended or adjusted under 35 U.S.C. 154(b) by 172 days.

(21) Appl. No.: 13/692,571

(22) Filed: Dec. 3, 2012

Related U.S. Application Data

(60) Provisional application No. 61/568,544, filed on Dec. 8, 2011.

(51) Int. Cl.
*H04B 1/04* (2006.01)

(52) U.S. Cl.
CPC .......................................... *H04B 1/04* (2013.01)

(58) Field of Classification Search
CPC . H04L 27/34; H04L 2027/0057; H04L 27/02; H04L 27/18
USPC ............... 455/108, 110, 115.1, 114.2, 114.3, 455/127.1, 127.2; 375/298, 300, 302, 308
See application file for complete search history.

(56) References Cited

U.S. PATENT DOCUMENTS

| | | | |
|---|---|---|---|
| 8,131,229 B1* | 3/2012 | Wilson et al. | 455/102 |
| 2009/0258612 A1* | 10/2009 | Zhuang et al. | 455/110 |
| 2010/0246716 A1* | 9/2010 | Wang et al. | 375/298 |

OTHER PUBLICATIONS

Philippe, "A Zero Crossing Avoidance Predistortion Technique for Polar Transmitters", Electronics, Circuits and Sytems, 2008, ICECS 2008, Aug. 31, 2008-Sep. 3, 2008, 4 pages.
Zhuang et al., "A Technique to Reduce Phase/Frequency Modulation Bandwidth in a Polar RF Transmitter", IEEE Transactions on Circuits and Systems, vol. 57, No. 8, Aug. 2010, 12 pages.

* cited by examiner

*Primary Examiner* — Nhan Le

(57) ABSTRACT

Embodiments of the present disclosure provide system and method for generating a transmission signal. A transmitter generates and transmits a transmission signal based on signal components. Circuitry that is coupled to the transmitter receives complex plane components of a signal to be transmitted and alters the signal such that a complex plane trajectory of the signal passes nearer to an origin of a complex plane of the complex plane trajectory than does an original complex plane trajectory of the signal. The circuitry determines the signal components to be transmitted by the transmitter based on the altered signal.

16 Claims, 14 Drawing Sheets

AVOIDING FREQUENCY SPIKES IN MODULATED SYSTEMS

CROSS REFERENCE TO RELATED APPLICATIONS

This present disclosure claims priority to U.S. Provisional Patent Application No. 61/568,544, filed on Dec. 8, 2011, incorporated herein by reference.

TECHNICAL FIELD

Embodiments of the present disclosure relate to the field of wireless transmitters, and more particularly to low-power phase-modulation transmitters.

BACKGROUND

The background description provided herein is for the purpose of generally presenting the context of the disclosure. Work of the presently named inventors, to the extent that it is described in this background section, as well as aspects of the description that may not otherwise qualify as prior art at the time of filing, are neither expressly nor impliedly admitted as prior art against the present disclosure.

Direct conversion transmitters are commonly utilized in phase-modulated wireless transmission systems. In direct conversion, the signal to be transmitted is directly generated at radio frequency through a combination of I and Q paths. The resulting signal is then amplified by a linear power amplifier and transmitted. One alternative to the direct conversion transmitter is the polar transmitter. In a polar transmitter, the signal to be transmitted is generated based on a phase signal and an amplitude signal, which is then amplified by a non-linear amplifier. Because non-linear amplifiers can be more efficient than linear amplifiers, polar transmitters can be more efficient than direct conversion transmitters. But when the trajectory of the signal to be transmitted crosses near or at the origin of the complex plane, the abrupt variation in the output phase that results causes a frequency spike in a polar transmitter. The drawback to a conventional polar transmitter is therefore that it requires wide-band amplitude and wide-band phase modulation, which are not easy to achieve and result in high power consumption.

Zero Crossing Avoidance is a technique that alters the trajectory of the signal to be transmitted such that the signal avoids passing near to the origin of the complex plane. This technique results in less of a frequency spike because the trajectory avoids the origin, and the phase and the frequency of the resulting signal has a smoother transition.

SUMMARY

The present disclosure provides a system for generating a transmission signal. A transmitter generates and transmits a transmission signal based on signal components. Circuitry that is coupled to the transmitter receives complex plane components of a signal to be transmitted and alters the signal such that a complex plane trajectory of the signal passes nearer to an origin of a complex plane of the complex plane trajectory than does an original complex plane trajectory of the signal. The circuitry determines the signal components to be transmitted by the transmitter based on the altered signal.

In some embodiments the circuitry outputs an inversion signal to the transmitter at a point in time that corresponds to the altered signal passing nearer to the origin, and the transmitter inverts an amplitude of the transmission signal based on the inversion signal. In some embodiments, the signal components include an amplitude component and a phase component, and the circuitry refrains from shifting a phase of the phase component at a point in time that corresponds to the altered signal passing nearer to the origin.

In some embodiments the signal components of the signal include an amplitude component and a phase component, and the circuitry is configured to output the amplitude component as an inverted amplitude component at a point in time that corresponds to the altered signal passing nearer to the origin. The circuitry refrains from shifting a phase of the phase component at the point in time that corresponds to the altered signal passing nearer to the origin.

In some embodiments the signal components of the signal include an amplitude component and a phase component. A polar transmitter generates the transmission signal based on the amplitude component, the phase component, and an inversion signal output by the circuitry. The polar transmitter also inverts the amplitude of the transmission signal based at least on the inversion signal.

In some embodiments, the circuitry alters the signal such that the complex plane trajectory of the signal intersects the origin of the complex plane.

The present disclosure also provides a method for generating a transmission signal. Complex plane components of a signal are received and the signal is altered such that a complex plane trajectory of the signal passes nearer to an origin of a complex plane of the complex plane trajectory. The signal components of the altered signal are output to a transmitter for transmission.

In some embodiments an inversion signal is output to the transmitter at a time that corresponds to a complex plane trajectory of the altered signal passing nearer to the origin of the complex plane, and the method refrains from shifting a phase component of the signal components of the altered signal at the time that corresponds to the altered signal passing nearer to the origin of the complex plane.

In some embodiments an inverted amplitude signal of the signal components is output at the time that corresponds to the altered signal passing nearer to the origin of the complex plane.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Figure 1:
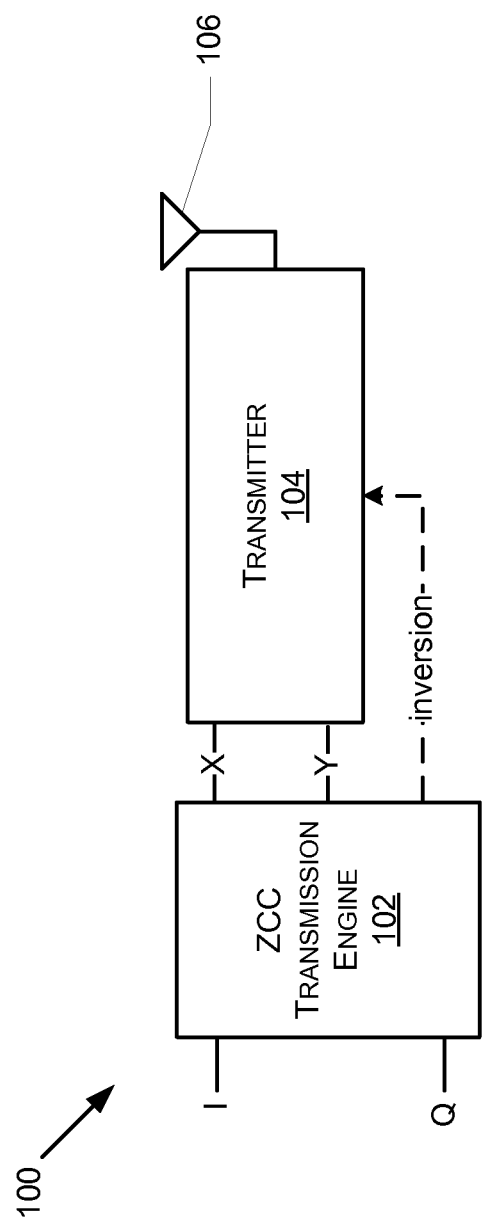
FIG. 1 is a schematic diagram of an example zero crossing coercion (ZCC) transmission system configured to alter a signal to be transmitted so that its trajectory passes nearer to or intersects the origin.

As noted above, polar transmitters utilize relatively efficient non-linear amplifiers, but conventional polar transmitters include relatively inefficient oscillators in order to account for the abrupt transitions in phase that occur when the trajectory of the signal to be transmitted crosses near the origin of the complex plane. Embodiments of the present disclosure include various techniques to avoid abrupt transitions in phase that are associated with trajectory crossings near or at the origin of the complex plane.

In some embodiments a technique is utilized, referred to herein as Zero Crossing Coercion (ZCC), in which a transmission engine alters the trajectory of the signal to be transmitted so that the trajectory passes nearer to or intersects the origin. In conventional polar transmitters, the trajectory nearing or crossing the origin results in an abrupt phase change (exactly or nearly a 180-degree phase change) and an undesirable instantaneous frequency in a polar transmitter. But various embodiments of the present disclosure represent the trajectory nearing or crossing the origin as an inversion of the output signal amplitude, rather than a 180-degree phase change (or near 180-degree phase change), which avoids the undesirable instantaneous frequency of a polar transmitter.

Some embodiments of the ZCC transmission engine output not only phase and amplitude signals to the transmitter as in conventional polar transmitter systems, but also an inversion signal. The ZCC transmission engine also refrains from altering the phase signal by 180 degrees (or close to 180 degrees) when the trajectory nears or crosses the origin. Polar transmitters according to embodiments utilize the inversion signal to invert the amplitude of the transmission signal. These techniques, by avoiding a 180-degree phase change or near 180-degree phase change in the phase signal, allow relatively efficient polar transmitters to be utilized without greatly impacting error performance of the phase-modulated transmission signals.

In different embodiments, linear amplification using non-linear components (LINC) transmitters may be utilized in a ZCC transmission system. LINC transmitters do not produce large frequency spikes when the trajectory of the signal to be transmitted crosses the origin. Embodiments of transmission systems that utilize ZCC and LINC transmitters may not utilize an inversion signal, or refrain from shifting a phase signal by 180 degrees or by nearly 180 degrees when the trajectory crosses or nears the origin, since LINC transmitters do not produce a large frequency spike when the trajectory crosses the origin.

In some embodiments, a technique, referred to herein as anticipated frequency clamping (AFC), is utilized to avoid an abrupt phase change in the phase-modulated signal. In conventional frequency clamping, the frequency is kept at a maximum value until the phase error is cancelled. Anticipated frequency clamping applies this process in anticipation of the instantaneous frequency of the transmitter exceeding the maximum frequency of the frequency mask, thereby resulting in less error than conventional frequency clamping. By avoiding frequency spikes associated with the trajectory nearing or crossing the origin, anticipated frequency clamping enables power-efficient polar transmitters to be utilized.

These techniques are described below with respect to the figures.

Zero Crossing Coercion

FIG. 1 is a schematic diagram of an example zero crossing coercion (ZCC) transmission system 100 configured to alter a signal to be transmitted so that its trajectory passes nearer to or intersects the origin. A ZCC transmission engine 102 receives complex plane components of the signal to be transmitted, which may include I (in-phase signal) and Q (quadrature phase signal) coordinates. The signal to be transmitted may be a digital modulated signal that encodes digital data. The ZCC transmission engine 102 may include circuitry, such as a microprocessor executing stored code; alternatively, the ZCC transmission engine 102 may include circuitry, such as an application-specific integrated circuit (ASIC), a programmable circuit such as a field-programmable gate array (FPGA), and so forth. The transmission engine may be integrated with the transmitter 104 and/or other components into a single package, such as a system-on-chip (SOC).

The ZCC transmission engine 102 alters the signal such that a complex plane trajectory of the signal passes nearer to or intersects the origin of the complex plane. The ZCC transmission engine 102 determines whether the complex plane trajectory of the original signal comes within a threshold distance of the origin. If so, then the ZCC transmission engine 102 determines a coercion vector that brings the nearest point of the trajectory to the origin. The ZCC transmission engine 102 selects an impulse, convolves the impulse with the coercion vector to produce a coercion signal. The transmission engine then adds the signal to be transmitted to the coercion signal to produce an altered signal.

The ZCC transmission engine 102 determines signal components X and Y of the altered signal. In embodiments, such as where the transmitter 104 is a polar transmitter, the components X and Y may be an amplitude signal (A) and a phase signal (φ). In other embodiments, such as where the transmitter 104 is a LINC transmitter, the components may be two phase signals. The ZCC transmission engine 102 may also in some embodiments output an inversion signal to the transmitter 104. The transmitter 104 utilizes the components X and Y, along with the inversion signal (if present), to produce a transmission signal for transmission on antenna 106. By bringing the trajectory to or near the origin and outputting an inversion signal upon the trajectory nearing or crossing the origin, the transmission system 100 avoids an abrupt transition in the phase signal and the associated frequency spike.

In theory, an inversion of the amplitude of the transmission signal is indistinguishable from a 180-degree phase shift that occurs when the signal trajectory crosses the origin. In embodiments that alter the signal such that its trajectory intersects the origin, the signal alteration can be represented as an inversion of the amplitude with theoretically zero impact on error performance. In practice, the alteration of the signal introduces errors that are handled by the receiver using error recovery or correction techniques. Thus, as long as the error introduced is within the range set by the relevant telecommunication standard, the error performance of the signal alteration is acceptable.

In embodiments that alter the signal such that its trajectory nears, but does not precisely intersect, the origin of the complex plane, inverting the amplitude of the transmission signal is an approximation of the near 180-degree phase shift that occurs when the origin nears but does not cross the origin. In these embodiments, the errors introduced may be greater than if the signal were altered such that its trajectory precisely intersected the origin. But in practice, exact intersections may not be necessary or even always computationally feasible, and the additional error caused by representing a near 180-degree phase shift as an inversion may be kept within the error requirements of the relevant telecommunication standard(s) of the communication.

Figure 2:
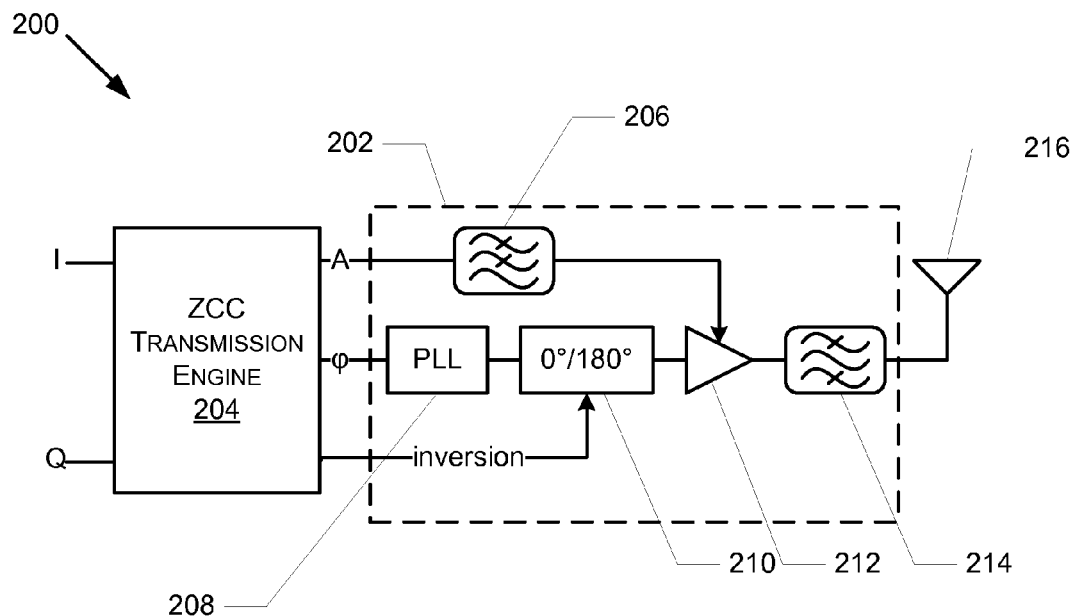
FIG. 2 is a schematic diagram of an example ZCC transmission system that includes a polar transmitter configured to accept an inversion signal.

FIG. 2 is a schematic diagram of an example ZCC transmission system 200 that includes a polar transmitter 202 configured to accept an inversion signal. The ZCC transmission engine 204, which may be the same as or similar to the ZCC transmission engine 102, receives I and Q components of a signal to be transmitted, alters the signal such that its trajectory passes nearer to or intersects the origin, and outputs polar components of the altered signal—including amplitude (A) and phase (φ) signals—along with an inversion signal to represent a 180-degree (or near 180-degree) phase change as an inversion. The ZCC transmission engine 204 also refrains from shifting the phase signal by nearly or exactly 180 degrees at a time that the altered signal trajectory nears or crosses the origin.

The polar transmitter 202 includes low-pass filter 206 to receive the amplitude signal, and a PLL 208 to receive the phase signal. PLLs used in various embodiments may have varying topologies, and they may be either analog or digital. Because the ZCC transmission engine 204 refrains from shifting the phase signal by 180 degrees (or nearly 180 degrees) upon the trajectory nearing or crossing the origin, the PLL 208 may be a relatively low-power PLL that does not need to be engineered to handle such abrupt phase changes. An inversion component 210 receives the inversion signal and causes an inversion of the output of the PLL 208 to represent a 180-degree (or near 180-degree) phase change. In alternative embodiments, the inversion component 210 may be coupled to the output of the low-pass filter 206, or arranged in some other manner within the polar transmitter 202; the location of the inversion component 210 in FIG. 2 is used for illustrative purposes only.

An envelope restoration amplifier 212 mixes the filtered amplitude signal and the phase modulated signal, from the PLL 208 and the inversion component 210, to generate a transmission signal, which is filtered by the band pass filter 214 and transmitted on antenna 216.

Figure 3A:
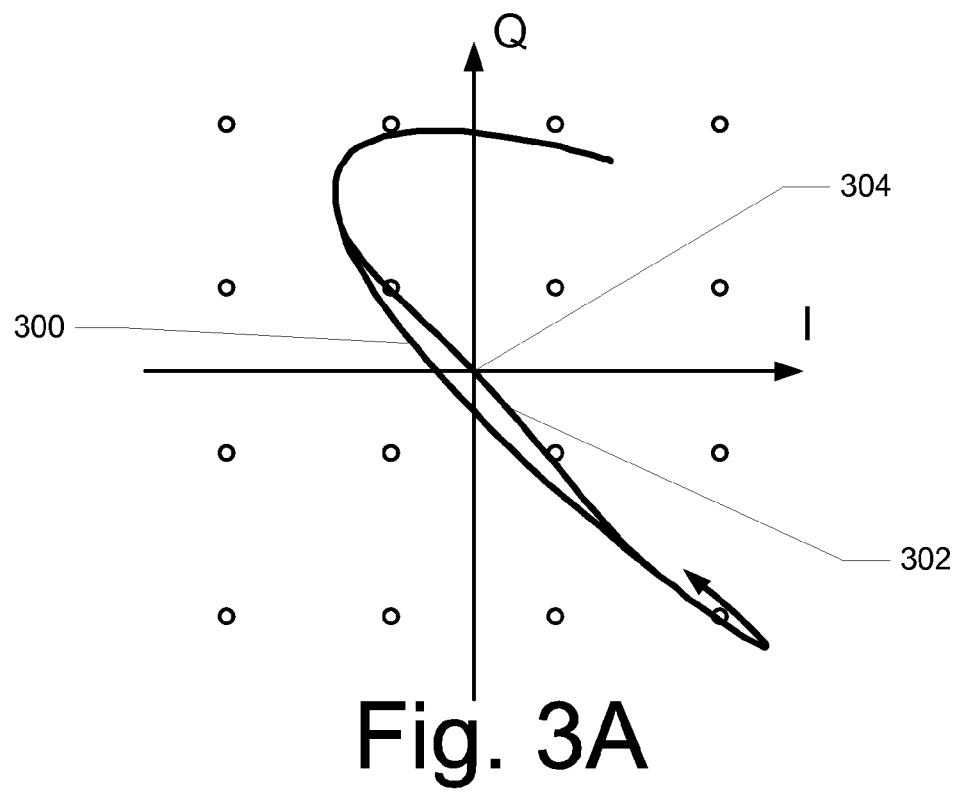
FIG. 3A illustrates a trajectory of an original signal and a trajectory of an altered signal that passes nearer to or intersects the origin of a complex plane.

FIG. 3A illustrates a trajectory 300 of an original signal and a trajectory 302 of an altered signal that passes nearer to or intersects the origin 304 of a complex plane. The trajectory 300 is determined by a ZCC transmission engine, such as the ZCC transmission engine 102 or the ZCC transmission engine 204, based on I and Q components of the signal to be transmitted. The direction of the trajectory 300 represents the change in the signal over time. The precise trajectory for a particular signal will depend on the particular signal; trajectory 300 is an example described herein for the sake of illustration. The trajectory 300 of the original signal passes near to the origin 304. When the signal's trajectory 300 passes within a threshold distance of the origin 304, the ZCC transmission engine alters the signal such that its trajectory 302 nears or crosses the origin 304. Trajectory 302 deviates from trajectory 300 such that it passes nearer to or intersects the origin 304.

Figure 3B:
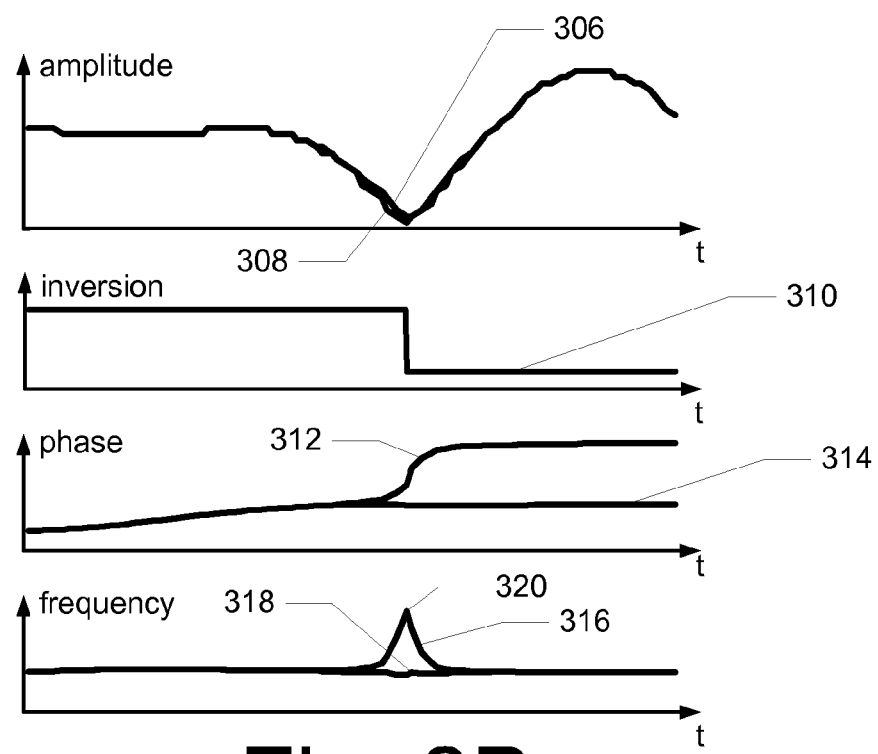
FIG. 3B illustrates a comparison of example signals from a conventional polar transmission system and example signals from a ZCC transmission system.

FIG. 3B illustrates a comparison of example signals from a conventional polar transmission system and example signals from a ZCC transmission system. The amplitude graph shown in FIG. 3B includes two amplitude signals 306 and 308. Amplitude signal 306 represents an example output amplitude signal without ZCC, and ZCC amplitude signal 308 represents an example output amplitude signal with ZCC, such as may be output by the ZCC transmission engine 102 or ZCC transmission engine 204. Both amplitude signal 306 and ZCC amplitude signal 308 are very similar to one another. The two amplitude signals are not identical due to the small amount of error introduced by the signal alteration. The inversion graph represents an inversion signal 310 output from the ZCC transmission engine. The phase graph shown in FIG. 3B represents an example phase signal 312 without ZCC, and example ZCC phase signal 314, such as may be output by the ZCC transmission engine 102 or ZCC transmission engine 204. And the frequency graph shown in FIG. 3B represents the instantaneous frequency 316 of the non-ZCC phase signal 310 and the ZCC instantaneous frequency of the 318 of the ZCC phase signal 314.

In the example illustrated in FIG. 3B, the rise in the non-ZCC phase signal 310 occurs at the point where trajectory 300 of the original signal passes near the origin 304. The result is an instantaneous frequency response 320 in the non-ZCC instantaneous frequency 316. The instantaneous frequency peak 320 may cause the transmission system to violate a frequency mask requirement. And the possibility of a high instantaneous frequency 320, even if rare, requires implementation of a relatively complicated oscillator in the transmitter that, depending on the oscillator design, may also be power inefficient.

But the ZCC instantaneous frequency 318 is relatively flat. This is because the ZCC phase signal 314 is kept relatively flat as the trajectory 302 of the altered signal passes through the origin 304. Instead of shifting the ZCC phase signal 314 by 180 degrees (or nearly 180 degrees) when the trajectory nears or crosses the origin, the ZCC transmission engine indicates the 180-degree (or near 180-degree) phase shift by down-shifting the inversion signal 310 (other origin crossings or near-crossings may be indicated by an up-shift of the inversion signal 310). Normally, the trajectory of a signal being output by a polar transmitter nearing or crossing the origin 304 would cause the large frequency spike 320. But by representing the 180-degree (or near 180-degree) phase shift as an inversion signal and maintaining the ZCC phase signal 314 relatively flat, the transmission system is able to maintain a mild instantaneous frequency at the point where the trajectory 302 nears or crosses the origin without greatly impacting the error characteristics of the transmission system.

Figure 3C:
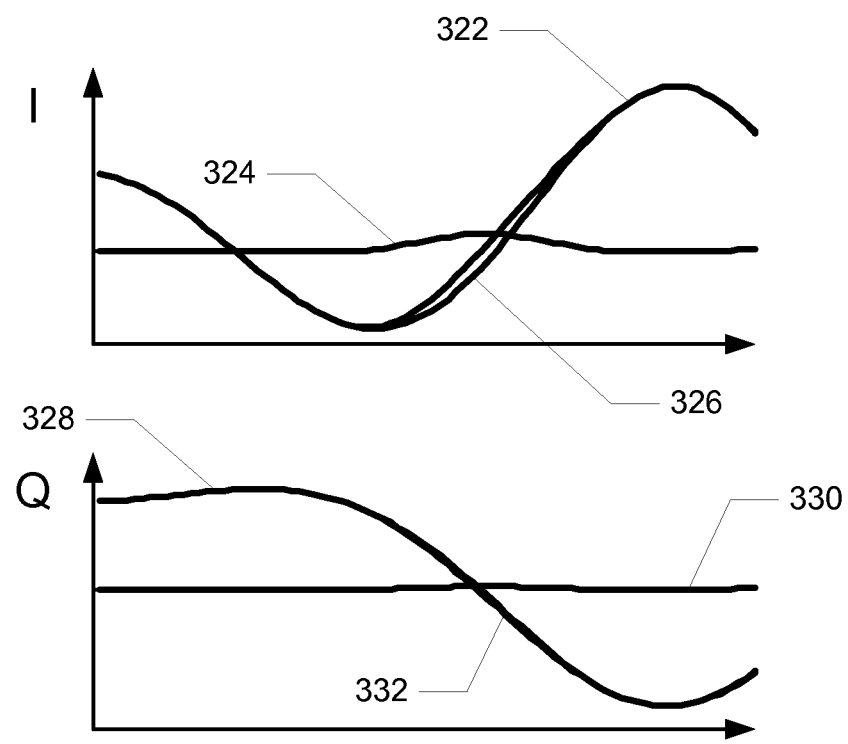
FIG. 3C illustrates I and Q components of both the original signal and the altered signal, as well as an example zero-crossing coercion (ZCC) signal used to create the altered signal.

FIG. 3C illustrates I and Q components of both the example original signal and the example altered signal, as well as an example zero-crossing coercion (ZCC) signal used to create the altered signal. As noted above, the ZCC transmission engine determines whether the trajectory 300 of a signal to be transmitted comes within a threshold distance of the origin 304 and, if it does, the ZCC transmission engine identifies a coercion vector, convolves the coercion vector with an impulse to generate a coercion signal, and then sums the original signal with the coercion signal to produce the corrected signal. In the example illustrated in FIG. 3C, the original in-phase signal (I) 322 is summed with the in-phase coercion signal 324 to produce the altered in-phase signal 326. Similarly, the original quadrature phase signal (Q) 328 is summed with the quadrature coercion signal 330 to produce the altered quadrature signal 332 (the original quadrature signal 328 and the altered quadrature signal 332 are very similar to one another and thus appear overlaid with one another in FIG. 3C). In this way, the altered signals 326 and 332 are produced. The coercion signals 324 and 330 represent errors that are introduced to the signal to be transmitted. These signal errors are acceptable as long as the overall error of the transmission signal remain with the error requirements of the wireless standard that is being utilized.

Figure 4:
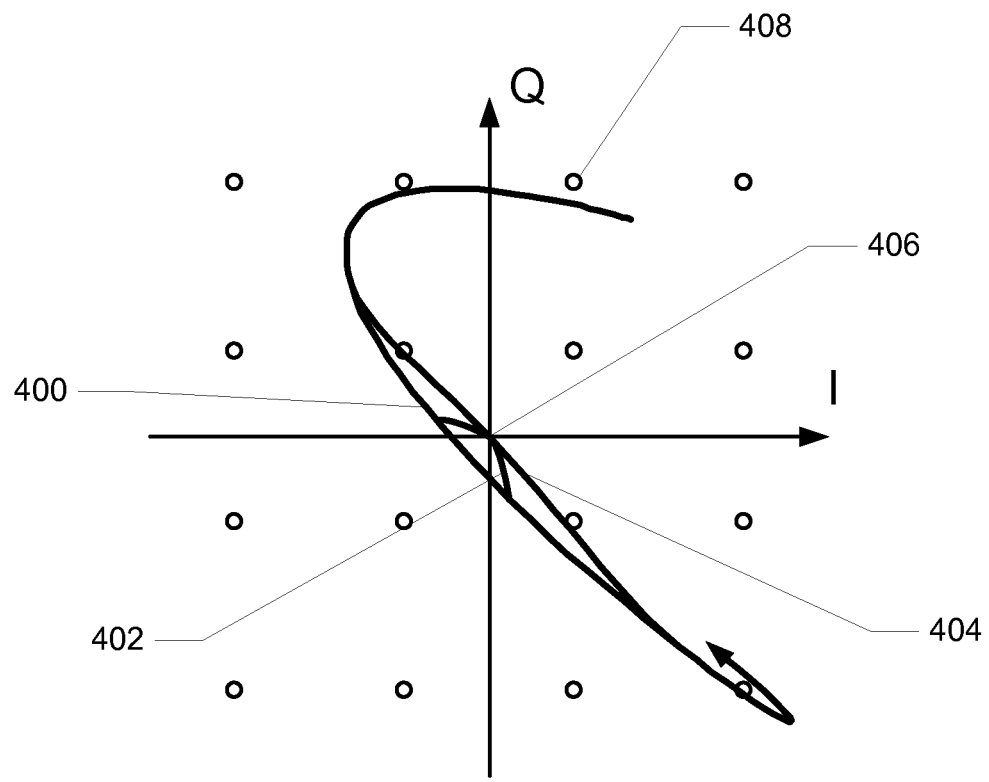
FIG. 4 illustrates the trajectories of two different altered signals; a first altered signal has a trajectory with a relatively abrupt transition to the origin, and a second altered signal has a trajectory with a smoother transition to the origin.

FIG. 4 illustrates the trajectories of two different altered signals; a first altered signal has a trajectory 402 with a relatively abrupt transition to the origin, and a second altered signal has a trajectory 404 with a smoother transition to the origin. The original signal has a trajectory 400. Based on the trajectory 400 passing within a threshold distance of the origin 406, a transmission engine alters the signal such that its trajectory passes nearer to or intersects the origin 406.

As noted above, the transmission engine determines a coercion vector which brings to the origin 406 the point on the original trajectory 400 that is nearest to the origin 406. The transmission engine convolves the coercion vector with an impulse to produce the coercion signal, which is then summed with the original signal to produce an altered signal, such as the first altered signal trajectory 402 and the second altered signal trajectory 404. The selection of an impulse to convolve with the coercion vector can be arbitrary, but the impulse determines how smoothly or abruptly the trajectory of the altered signal deviates from the original trajectory 400. For example, the first altered signal trajectory 402 is relatively abrupt while the second altered signal trajectory 404 is relatively smooth.

There is a trade-off in the selection of a smooth or abrupt deviation of the altered trajectory. The more abrupt the deviation, as in the first altered signal trajectory 402, the greater the frequency increase, which may cause the transmission signal to exceed the frequency mask requirements of the wireless standard. On the other hand, the smoother the transition, the greater the introduced error will be in the transmission signal.

To understand why the error is greater with a smoother deviation, consider the constellation points 408 in FIG. 4. The constellation points 408 represent the points in the trajectory 400 (or 402 or 404) where the receiver will sample the signal to determine the binary data that is encoded by the transmission signal. The more abrupt the deviation from the original trajectory, as with the first altered signal trajectory 402, the less likely the altered signal trajectory is to deviate away from, or towards, one of the constellation points 408. On the other hand, the smoother the deviation, as with the second altered signal trajectory 404, the more likely the altered signal trajectory is to deviate away from, or towards, one of the constellation points 408. Deviations away from or towards one of the constellation points 408 increases the probability that a sampling error will occur in the receiver, thereby causing an erroneous symbol on the receiver.

For these reasons, the transmission engine may select the impulse to be convolved with the coercion vector so as to balance instantaneous frequency concerns with predictions of the transmission signal error response (such as may be determined by predictions of error vector magnitude (EVM)). Thus, in some instances, the signal may be altered such that its trajectory has a relatively smooth deviation from the original trajectory to maintain a lowered instantaneous frequency; in other instances the signal may be altered such that its trajectory has a relatively abrupt deviation to reduce the error.

Figure 5A:
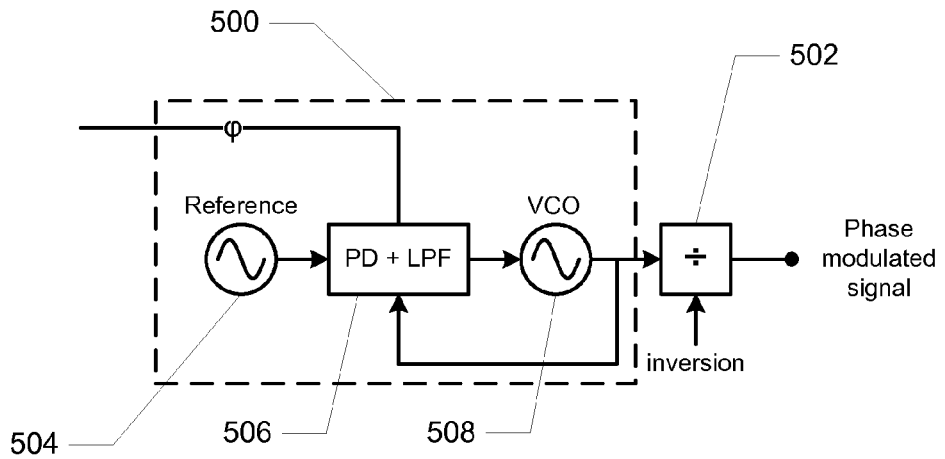
FIG. 5A is a schematic diagram of a PLL and a frequency divider configured to accept an inversion signal for use in a polar transmitter according to various embodiments.

FIG. 5A is a schematic diagram of a PLL 500 and a frequency divider 502 configured to accept an inversion signal for use in a polar transmitter according to various embodiments. The PLL 500 may be the same as or similar to the PLL 208 of FIG. 2. The frequency divider 502 is an example of an inversion component, such as the inversion component 210 of FIG. 2. The PLL 500 includes a reference signal source 504, a phase detector/low pass filter (PD+LPF) circuit 506 (shown combined for the sake of illustration only), and a voltage-controlled oscillator (VCO) 508. The phase detector/low pass filter circuit 506 receives as input the phase signal (φ) from a ZCC transmission engine (such as the ZCC transmission engine 204) and the reference signal from the reference signal source 504. The PD+LPF circuit 506 produces a voltage based on the phase difference between the reference signal and the phase signal from the ZCC transmission engine. The VCO 508 receives the voltage produced by PD+LPF circuit 506 as input, and generates a phase-modulated signal with a phase that is based on the input voltage. The frequency divider 502 receives the phase-modulated signal and divides the frequency of the phase-modulated signal by a certain amount. The frequency divider 502 also accepts as input the inversion signal in order to effectuate an inversion of the signal, which is the equivalent of a 180-degree phase change, or a close approximation of a near 180-degree phase change.

Figure 5B:
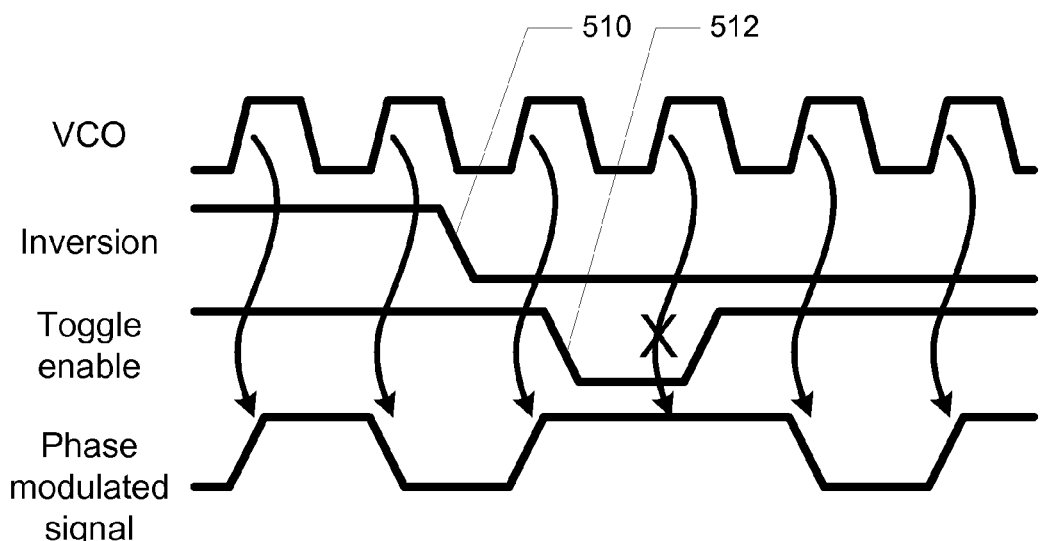
FIG. 5B illustrates timing diagrams for various signals related to the operation of a frequency divider of a polar transmitter configured to accept an inversion signal.

FIG. 5B illustrates timing diagrams for various signals related to the operation of a frequency divider 502 of a polar transmitter configured to accept an inversion signal. The frequency divider 502 accepts the inversion signal, which acts on the state variable of the divider to change the output sign of the phase-modulated signal. During operation, the frequency divider 502 toggles the phase-modulated signal every time the input signal (VCO) shows a rising edge. The frequency divider 502 sets a toggle enable, based on the state of the inversion signal, and performs no toggling for any cycle where the toggle enable is not set. In the example shown in FIG. 5B, the inversion signal changes state at 510 and in the following VCO cycle, the toggle enable drops to a lower voltage at 512 based on the change in the inversion signal. The frequency divider 502 therefore does not toggle the phase-modulated signal during the VCO cycle in which the toggle enable is set to the lower voltage (denoted in FIG. 5B as an "X"). In the following VCO cycle, the toggle enable is set back to the higher voltage (because the inversion signal has not changed), and the phase-modulated signal is inverted again at the rising edge of the VCO signal. In this way, the frequency divider 502 causes a 180-degree (or near 180-degree) phase change of the phase-modulated signal based on the inversion signal. In a conventional polar transmitter, the VCO signal itself would manifest the phase change; but with the ZCC transmission systems according to embodiments, the phase change of the phase-modulated signal is effectuated by the inversion signal.

Figure 6A:
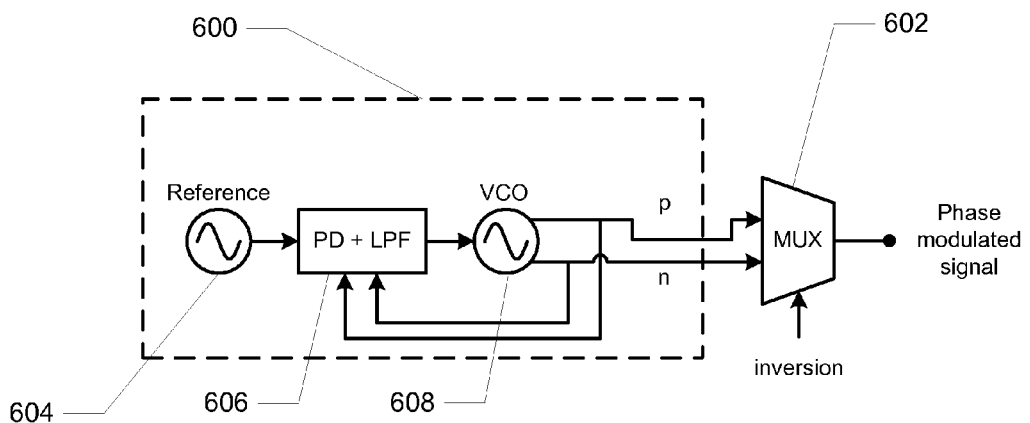
FIG. 6A is a schematic diagram of a PLL and a multiplexer configured to accept an inversion signal for use in a polar transmitter according to various embodiments.

FIG. 6A is a schematic diagram of a PLL 600 and a multiplexer 602 configured to accept an inversion signal for use in a polar transmitter according to various embodiments. The PLL 600 may be the same as or similar to the PLL 208 of FIG. 2. The multiplexer 602 is an example of an inversion component, such as the inversion component 210 of FIG. 2. The PLL 600 includes a reference signal source 604, a phase detector/low pass filter (PD+LPF) circuit 606 (shown combined for the sake of illustration only), and a voltage-controlled oscillator (VCO) 608. The PD+LPF circuit 606 receives as input the phase signal ($\phi$) from a ZCC transmission engine (such as the ZCC transmission engine 204) and the reference signal from the reference signal source 604. The PD+LPF circuit 606 produces a voltage based on the phase difference between the reference signal and the phase signal from the ZCC transmission engine. The VCO 608 receives the voltage produced by PD+LPF circuit 606 as input, and generates a differential phase-modulated signal with a phase that is based on the input voltage. The multiplexer 602 receives the differential phase-modulated signal. The multiplexer 602 also accepts as input the inversion signal and selects either the inverted phase-modulated signal or the non-inverted phase-modulated signal based on the inversion signal.

Figure 6B:
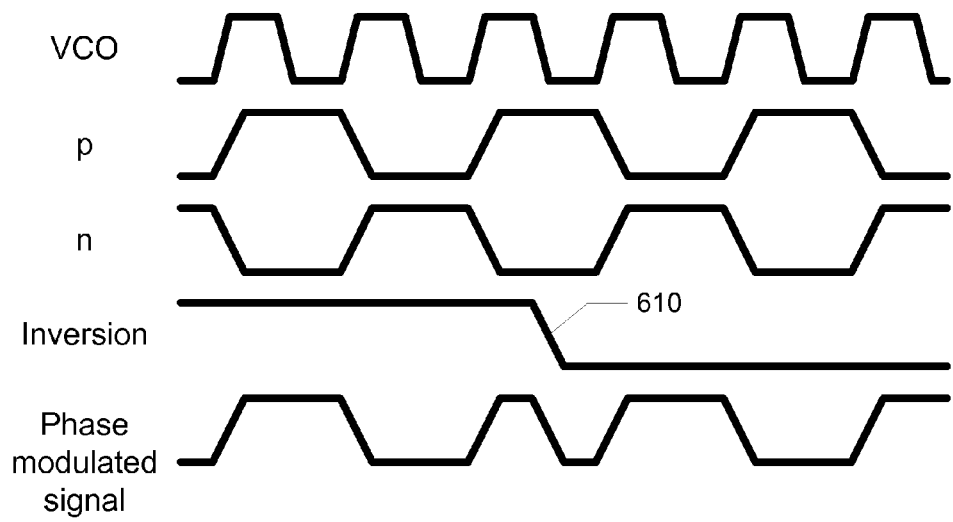
FIG. 6B illustrates timing diagrams for various signals related to the operation of a multiplexer of a polar transmitter configured to accept an inversion signal.

FIG. 6B illustrates timing diagrams for various signals related to the operation of a multiplexer of a polar transmitter configured to accept an inversion signal. The p and the n signals are the differential outputs of the VCO 608. The inversion signal drops to a low voltage at 610. Prior to the drop in the inversion signal at 610, the multiplexer 602 selects the p signal as the phase-modulated output. But upon the inversion signal dropping at 610, the multiplexer selects the n signal as the phase-modulated output. This effectuates a 180-degree (or near 180-degree) phase change in the phase-modulated signal. In a conventional polar transmitter, the VCO signal itself would manifest the phase change; but with the ZCC transmission systems according to embodiments, the phase change of the phase-modulated signal is effectuated by the inversion signal.

The presence of the multiplexer 602 may create a transition artifact in the phase-modulated signal when the inversion signal is changed. When the inversion signal is changed, a fast variation in the phase-modulated signal occurs. But because the inversion signal is changed when the amplitude of the phase-modulated signal is at zero, the artifact does not show up in the transmission signal. The transition in the inversion signal may therefore produce unwanted transitions, and create disturbances, but because the amplitude is zero, the disturbances do not show up in the phase-modulated output signal, but stop at the input of the power amplifier of the polar transmitter (such as the envelope restoration amplifier 212).

Figure 7A:
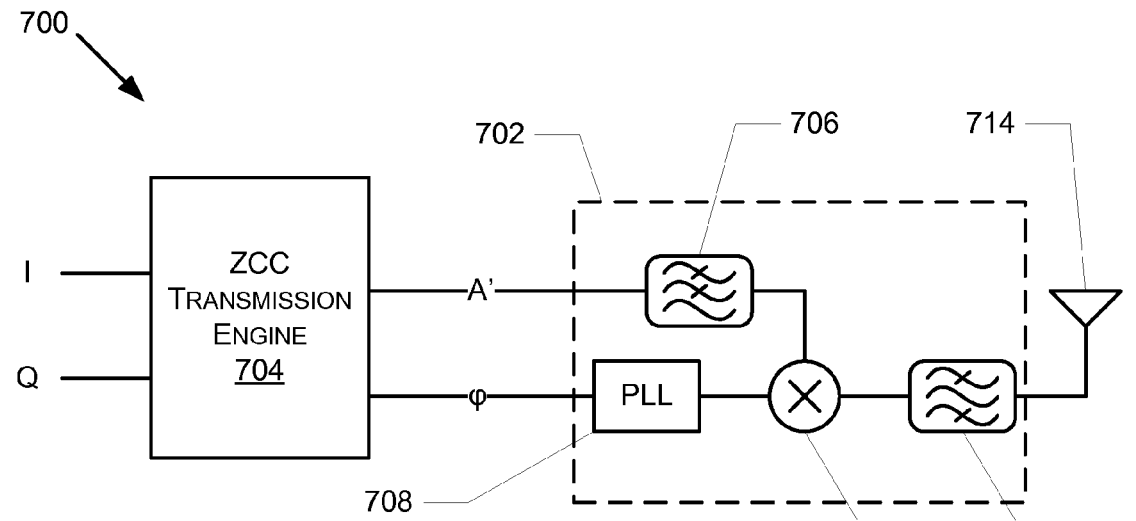
FIG. 7A is a schematic diagram of an example a ZCC transmission system that emits an inverted amplitude signal to a polar transmitter to effectuate a 180-degree (or near 180-degree) phase shift.

FIG. 7A is a schematic diagram of an example a ZCC transmission system 700 that emits an inverted amplitude signal to a polar transmitter 702 to effectuate a 180-degree (or near 180-degree) phase shift. The polar transmitter 702 includes low-pass filter 706 to receive the A' signal, (which is an amplitude signal that is inverted at the time that the trajectory of the altered signal passes nearer to or intersects the origin), and a PLL 708 to receive the phase signal. Because the ZCC transmission engine 704 refrains from shifting the phase signal by 180 degrees (or close to 180 degrees) upon the trajectory nearing or crossing the origin, the PLL 708 may be a relatively low-power PLL that does not need to be engineered to handle such abrupt phase changes. For example, avoiding high instantaneous frequency peaks will reduce the dynamic range requirement on the Local Oscillator of the PLL 708. Thus, depending on the specific design of the Local Oscillator, the relaxed dynamic range may result in a more power efficient design. The ZCC transmission engine 204 illustrated in FIG. 2A is configured to output a separate inversion signal, and the polar transmitter 202 illustrated in FIG. 2A includes the inversion component 210 to receive the separate inversion signal to effectuate a 180-degree (or near 180-degree) phase change. But the ZCC transmission engine 704 outputs an inverted amplitude signal to represent a 180-degree (or near 180-degree) phase change when the trajectory of the altered signal nears or crosses the origin. The mixer 710 accepts the phase-modulated signal from the PLL 708 and the filtered amplitude signal from the low-pass filter. The passband filter 712 filters the resulting signal and passes it to the antenna 714 for transmission.

Figure 7B:
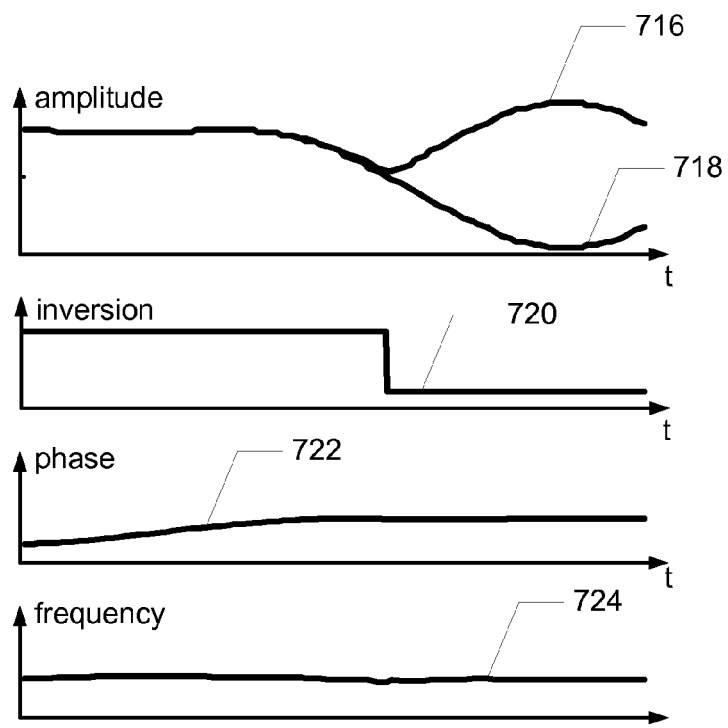
FIG. 7B illustrates timing diagrams for various signals related to the ZCC transmission system.

FIG. 7B illustrates timing diagrams for various signals related to the ZCC transmission system 700. The amplitude signal 716 represents the altered amplitude signal in its pure form (not inverted based on the inversion signal), while the A' signal 718 represents the amplitude signal that is inverted upon the trajectory nearing or crossing the origin. The A' signal 718 deviates from the pure amplitude signal 716 at the point that the inversion signal 720 drops (i.e., at the point that the trajectory nears or crosses the origin). The ZCC transmission machine 704 refrains from shifting the phase signal 722 at the point that the trajectory nears or crosses the origin, and the resulting instantaneous frequency 724 of the signal is therefore relatively flat.

Figure 8:
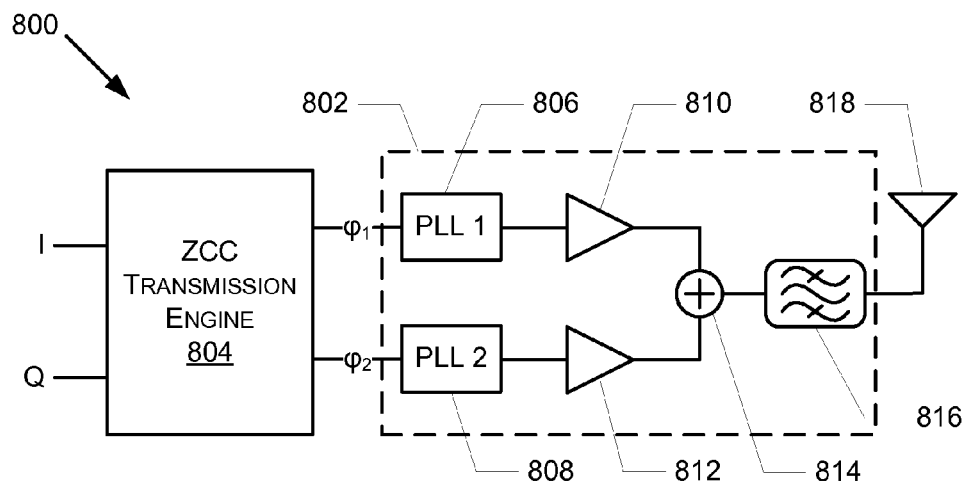
FIG. 8 illustrates a ZCC transmission system that utilizes a linear amplification using nonlinear components (LINC) transmitter.

FIG. 8 illustrates a ZCC transmission system 800 that utilizes a linear amplification using nonlinear components (LINC) transmitter 802. The ZCC transmission engine 804 receives I and Q components of a signal to be transmitted, and alters the signal such that its trajectory passes nearer to or intersects the origin of the complex plane. The ZCC transmission engine 804 outputs two phase signals $\phi_1$ and $\phi_2$ based on the altered signal. PLL 806 and PLL 808 receive the two phase signals, produce output phase-modulated signals, which are amplified by linear amplifiers 810 and 812. Adder 814 produces a combined signal, which is filtered by band-pass filter 816 and transmitted on antenna 818. The LINC transmitter 802 does not produce a large frequency spike when there is a 180-degree (or near 180-degree) phase change in the output signal. Unlike embodiments of ZCC transmission engines described herein that are used with polar transmitters, the ZCC transmission engine 804 does not output an inversion signal.

Anticipated Frequency Clamping

Figure 9:
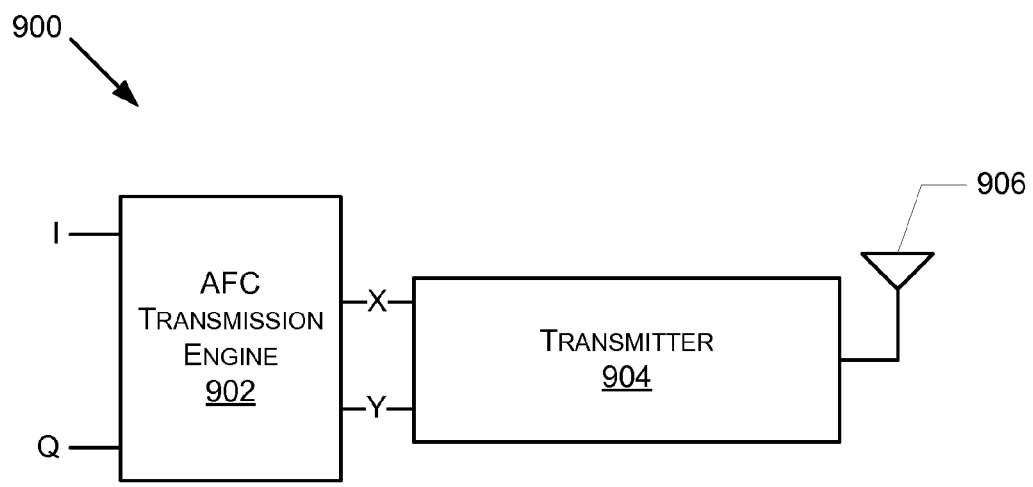
FIG. 9 illustrates an anticipated frequency clamping transmission system.

FIG. 9 illustrates an anticipated frequency clamping transmission system 900. As discussed above, conventional polar transmitters have the disadvantage of requiring robust VCOs capable of handling a large frequency spike associated with an abrupt phase change, which is associated with the trajectory of the signal intersecting or coming near to the origin of the complex plane. The Anticipated Frequency Clamping (AFC) transmission engine 902 receives I and Q components of the signal to be transmitted, and alters the signal in order to limit the instantaneous frequency. In conventional frequency clamping, a slew mode is applied to a phase signal ($\phi$), and once the frequency is clamped, the frequency is maintained at a maximum allowable value (e.g., a predetermined threshold) until the phase error is cancelled. The AFC transmission engine 902 anticipates the frequency spike—such as based on the trajectory of the signal to be transmitted—and a slew mode is applied to the phase signal prior to, and in anticipation of, the frequency exceeding the maximum allowable value. The result is a frequency clamp around the frequency peak, as is illustrated in FIG. 10. By applying a slew mode to the phase signal in anticipation of the frequency peak, the error added to the transmission signal by AFC is added at a point where the amplitude of the transmission signal is at or near zero. The error introduced with AFC therefore has less energy than with conventional frequency clamping.

The AFC transmission engine outputs components X and Y of the signal altered using AFC. The X and Y components may include an amplitude signal and a phase signal, such as where the transmitter 904 is a polar transmitter. The transmitter 904 produces a transmission signal that is transmitted on the antenna 906.

Figure 10B:
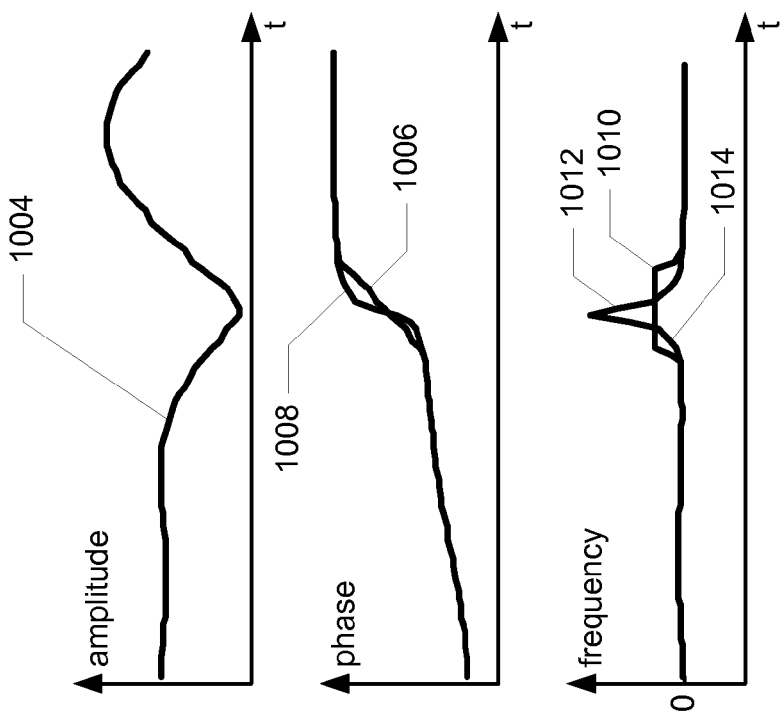
FIG. 10B illustrates signal graphs for various signals related to AFC.
Figure 10A:
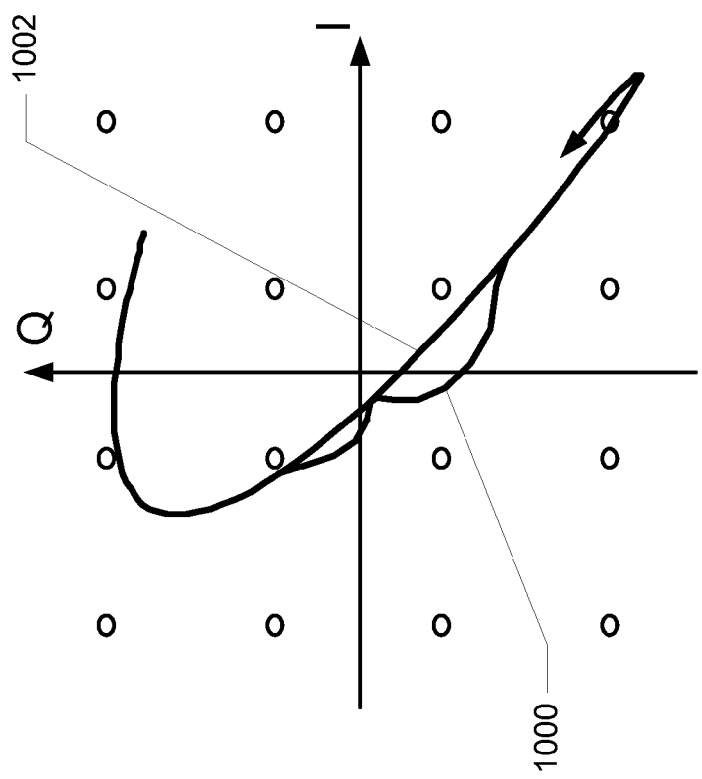
FIG. 10A illustrates a trajectory of an altered signal in the AFC transmission system.

FIG. 10A illustrates a trajectory 1000 of an altered signal in the AFC transmission system 900. The trajectory 1002 represents the trajectory of the original signal, before it is altered by the AFC transmission engine 902. FIG. 10B illustrates signal graphs for various signals related to AFC. The amplitude signal 1004 and the phase signal 1006 are output from the AFC transmission engine 902. As can be seen, the phase signal 1006 has a smoother transition to the new level than the phase signal 1008, which represents the phase signal output without AFC. As a result, the instantaneous frequency 1010 is clamped around the peak 1012 of the instantaneous frequency 1014 that would occur without AFC. As a result, the VCO of the PLL of the polar transmitter used in an AFC transmission system (such as the AFC transmission system 900) may not need to be as robust as if AFC were not used, thereby reducing power requirements for the transmission system.

Example Processes

Figure 11:
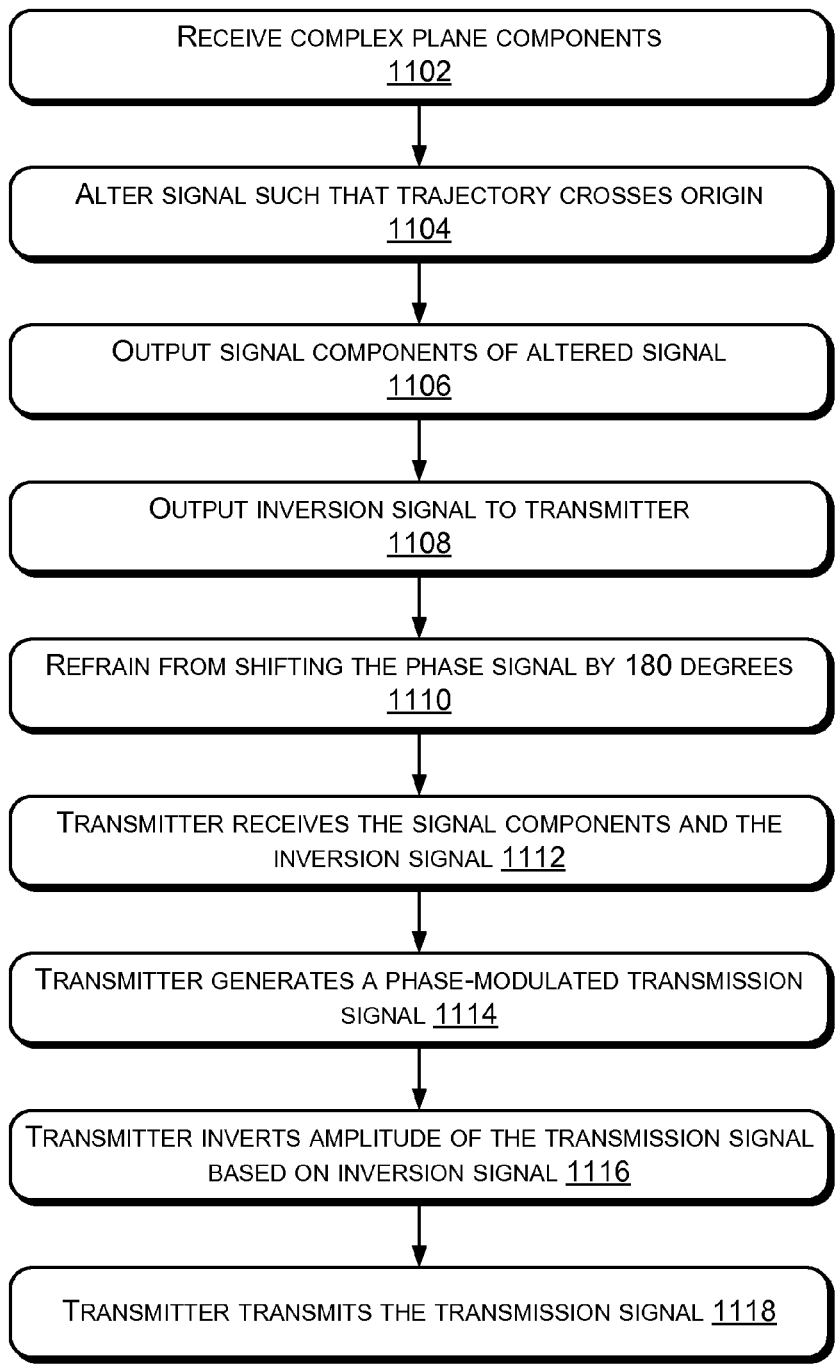
FIG. 11 is a flowchart showing an example process of generating a ZCC transmission signal.

FIG. 11 is a flowchart showing an example process 1100 of generating a ZCC transmission signal. At 1102, a transmission engine—such as the ZCC transmission engine 102—receives complex plane components of a signal to be transmitted. The complex plane components may include in-phase (I) signal and a quadrature (Q) signal coordinates.

At 1104, the transmission engine alters the signal such that a complex plane trajectory of the signal passes nearer to or intersects an origin of the complex plane.

At 1106, the transmission engine outputs, to a transmitter, signal components of the altered signal. The signal components may include polar components, such as an amplitude signal and a phase signal, such as where the transmitter is a polar transmitter. The signal components may include phase signals, such as where the transmitter is a LINC transmitter.

At 1108, the transmission engine outputs an inversion signal to the transmitter at a time that corresponds to the complex plane trajectory of the altered signal passing nearer to or intersecting the origin of the complex plane. In some other embodiments, the inversion signal may not be output (such as where a LINC transmitter is used). In still other embodiments, the transmission engine may output an A' signal, which is an amplitude signal that is inverted at the time that the trajectory of the altered signal passing nearer to or intersects the origin.

At 1110, the transmission engine refrains from shifting a phase signal of the signal components by exactly or approximately 180 degrees when the trajectory of the altered signal passes nearer to or intersects the origin of the complex plane. In a conventional transmission system utilizing a polar transmitter, the trajectory nearing or intersecting the origin would be accompanied by a 180-degree (or near 180-degree) phase shift of the phase signal, but some embodiments of the present disclosure represent a 180-degree (or near 180-degree) phase shift as an inversion, which is theoretically indistinguishable from a 180-degree (or near 180-degree) phase shift. In embodiments that utilize a LINC transmitter, the transmission engine may not refrain from shifting the phase signal by exactly or approximately 180 degrees.

At 1112, the transmitter receives the signal components and, in some embodiments, the inversion signal. At 1114, the transmitter generates a phase-modulated transmission signal based on the signal components.

At 1116, the transmitter utilizes the inversion signal to cause an inversion of the amplitude of the transmission signal. The transmitter may include a multiplexer, a frequency divider, or other inversion component configured to accept the inversion signal as input and to cause an inversion of the transmission signal based on the inversion signal.

At 1118, the transmitter causes the transmission signal to be transmitted. On the receiver side, the receiver will demodulate the received transmission signal as it would any other phase-modulated signal. In theory, an inversion of the amplitude is indistinguishable from a 180 phase shift, and is a close approximation of a near 180-degree phase shift. In practice, altering the signal so that its trajectory nears or crosses the origin, as well as inverting the amplitude instead of a 180-degree (or near 180-degree) phase shift in the transmission signal, may introduce errors into the transmission signal. The receiver may demodulate the received transmission signal and recover any errors therein using any of various conventional (or non-conventional) demodulation and error-correction/recovery techniques. Such techniques are beyond the scope of this disclosure.

Figure 12:
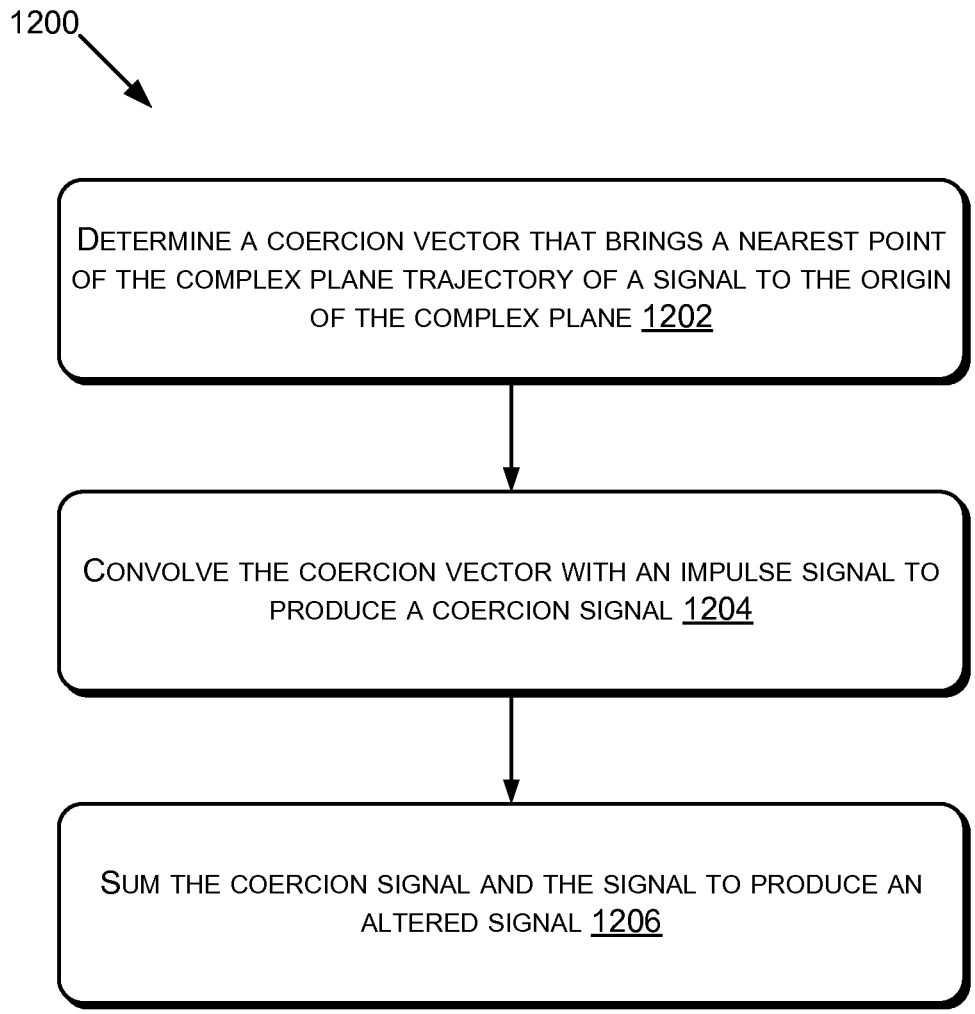
FIG. 12 is a flowchart showing an example process for altering a signal such that its trajectory passes nearer to or intersects the origin.

FIG. 12 is a flowchart showing an example process 1200 for altering a signal such that its trajectory passes nearer to or intersects the origin. At 1202, a transmission engine—such as the ZCC transmission engine 102—determines a coercion vector that brings a nearest point of the complex plane trajectory of the signal to the origin of the complex plane.

At 1204, the transmission engine convolves the coercion vector with an impulse signal to produce a coercion signal. The impulse may be selected in order to balance instantaneous frequency with EVM thresholds. At 1206, the transmission engine sums the coercion signal and the signal to produce the altered signal.

Figure 13:
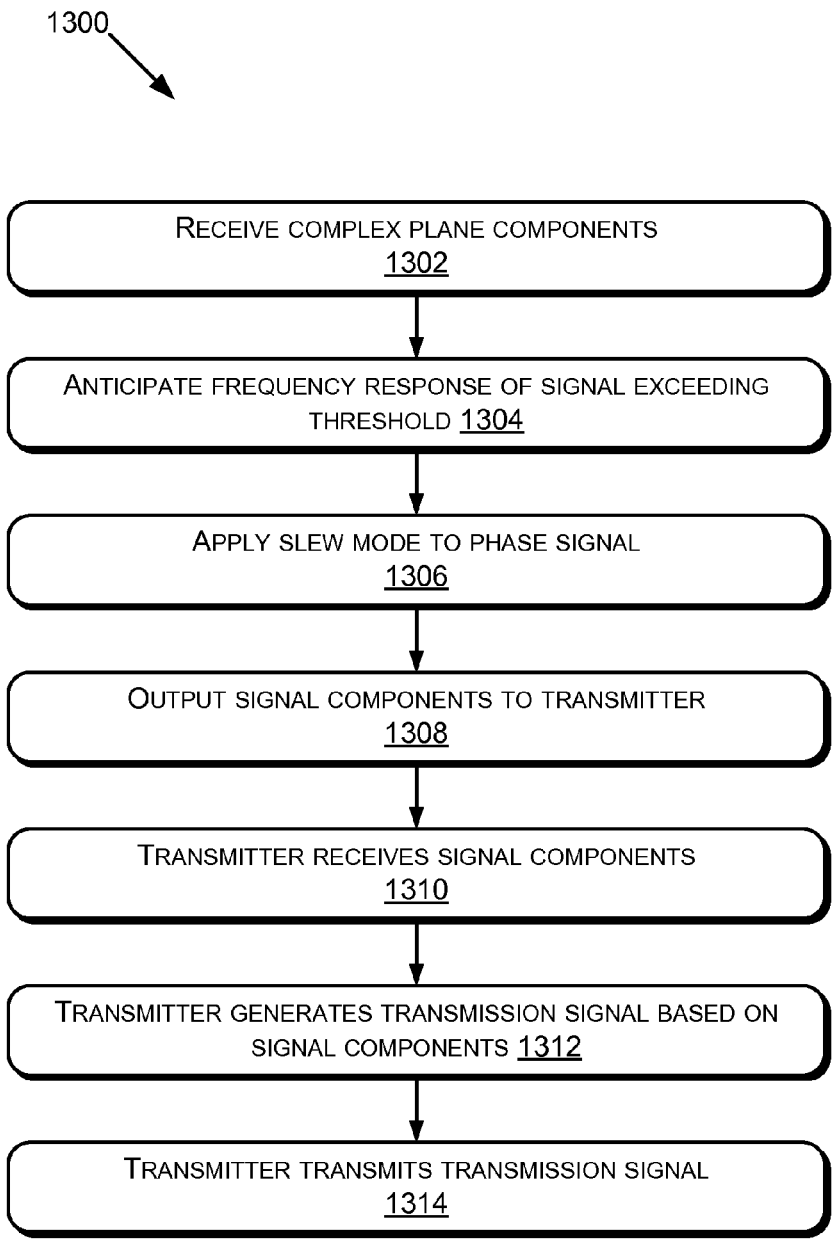
FIG. 13 is a flowchart showing an example process of generating an anticipated frequency clamping signal.

FIG. 13 is a flowchart showing an example process 1300 of generating an anticipated frequency clamping signal. At 1302, a transmission engine—such as the AFC transmission engine 902—receives complex plane components of a signal to be transmitted. The complex plane components may include in-phase (I) and quadrature (Q) coordinates of the signal to be transmitted.

At 1304, the transmission engine anticipates, such as based on a complex plane trajectory of the signal to be transmitted or other method, an instantaneous frequency of the signal exceeding a predetermined threshold, such as may be based on a frequency mask of a wireless standard.

At 1306, the transmission engine applies a slew mode to a phase signal in anticipation of the instantaneous frequency spike to alter the signal. Applying the slew mode smoothes out the phase signal and results in a lowered instantaneous frequency of the transmission signal.

At 1308, the transmission engine outputs signal components of the altered signal to a transmitter. The signal components may be polar components (e.g., an amplitude and phase signal), such as where the transmitter is a polar transmitter.

At 1310, the transmitter receives the signal components. At 1312, the transmitter generates a transmission signal based on the signal components. And at 1314, the transmitter transmits the transmission signal.

Conclusion

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments. Operations of processes 1100, 1200, and 1300 can be suitably combined and may comport with techniques and/or configurations described in connection with various embodiments.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. A system comprising:
   a transmitter configured to generate and transmit a transmission signal based on signal components; and
   a circuitry coupled to the transmitter, wherein the circuitry is configured to:
   (i) receive complex plane components of a signal to be transmitted;
   (ii) alter the signal such that a complex plane trajectory of the signal passes nearer to an origin of a complex plane of the complex plane trajectory than does an original complex plane trajectory of the signal;
   (iii) determine the signal components based on the altered signal; and
   (iv) output an inversion signal to the transmitter at a point in time that corresponds to the altered signal passing nearer to the origin,
   wherein the transmitter is further configured to invert an amplitude of the transmission signal based on the inversion signal.

2. The system of claim 1, wherein the complex plane components comprise I and Q coordinates of the complex plane.

3. The system of claim 1, wherein:
   (i) the signal components include an amplitude component and a phase component; and
   (ii) the circuitry refrains from shifting a phase of the phase component at the point in time that corresponds to the altered signal passing nearer to the origin.

4. The system of claim 1, wherein:
   (i) the signal components of the signal include an amplitude component and a phase component; and
   (ii) the transmitter is a polar transmitter configured to generate the transmission signal based on the amplitude component, the phase component, and the inversion signal output by the circuitry.

5. The system of claim 4, wherein the polar transmitter includes a frequency divider configured to invert the amplitude of the transmission signal based on the received inversion signal.

6. The system of claim 4, wherein polar transmitter includes a multiplexer configured to select one of (i) an inverted signal or (ii) a non-inverted signal as the transmission signal based on the inversion signal.

7. The system of claim 1, wherein the circuitry is configured to alter the signal by:
   (i) identification of a point of the original complex plane trajectory that is nearest to the origin of the complex plane;
   (ii) determination of a coercion vector that brings the nearest point of the complex plane trajectory nearer to the origin of the complex plane;
   (iii) a convolving of the coercion vector with an impulse signal to generate a coercion signal; and
   (iv) addition of the coercion signal to the signal to produce the altered signal.

8. The system of claim 7, wherein the impulse signal is selected based on a balancing of (i) a measure of error introduced to the signal by the addition of the coercion signal to the signal, and (ii) a power magnitude of one or more aspects of the transmission signal that are outside of a predefined frequency mask, and that are introduced by the addition of the coercion signal to the signal.

9. The system of claim 1, wherein the transmitter is a linear amplification using nonlinear components (LINC) transmitter configured to generate the transmission signal based on the signal components of the signal.

10. The system of claim 1, wherein the circuitry is further configured to alter the signal such that the complex plane trajectory of the signal intersects the origin of the complex plane.

11. A method, comprising:
    receiving complex plane components of a signal;
    altering the signal such that a complex plane trajectory of the signal passes nearer to an origin of a complex plane of the complex plane trajectory;
    outputting signal components of the altered signal to a transmitter; and
    outputting an inversion signal to the transmitter at a time that corresponds to a complex plane trajectory of the altered signal passing nearer to the origin of the complex plane.

12. The method of claim 11, further comprising:
    determining a coercion vector that brings a nearest point of the complex plane trajectory of the signal nearer to the origin of the complex plane;
    convolving the coercion vector with an impulse signal to produce a coercion signal; and
    summing the coercion signal and the signal to produce the altered signal.

13. The method of claim 11, further comprising:
refraining from shifting a phase component of the signal components of the altered signal at the time that corresponds to the altered signal passing nearer to the origin of the complex plane.

14. The method of claim 11, wherein the complex plane components include I and Q coordinates of the complex plane.

15. The method of claim 11, wherein the transmitter is one of a polar transmitter or a linear amplification using nonlinear components (LINC) transmitter.

16. The method of claim 11, further comprising altering the signal such that a complex plane trajectory of the altered signal intersects the origin of the complex plane.

* * * * *